US008956804B2

(12) United States Patent
Brizard et al.

(10) Patent No.: US 8,956,804 B2
(45) Date of Patent: Feb. 17, 2015

(54) SELF-ASSEMBLABLE POLYMER AND METHODS FOR USE IN LITHOGRAPHY

(75) Inventors: Aurelie Marie Andree Brizard, Eindhoven (NL); Sander Frederik Wuister, Eindhoven (NL); Roelof Koole, Eindhoven (NL); Emiel Peeters, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/123,943

(22) PCT Filed: Jun. 7, 2012

(86) PCT No.: PCT/EP2012/060784
§ 371 (c)(1),
(2), (4) Date: Dec. 4, 2013

(87) PCT Pub. No.: WO2012/175343
PCT Pub. Date: Dec. 27, 2012

(65) Prior Publication Data
US 2014/0113232 A1 Apr. 24, 2014

Related U.S. Application Data

(60) Provisional application No. 61/500,329, filed on Jun. 23, 2011, provisional application No. 61/538,030, filed on Sep. 22, 2011, provisional application No. 61/544,912, filed on Oct. 7, 2011.

(51) Int. Cl.
*G03F 7/26* (2006.01)
*G03F 7/004* (2006.01)
(Continued)

(52) U.S. Cl.
CPC .............. *G03F 7/004* (2013.01); *G03F 7/0002* (2013.01); *C30B 19/00* (2013.01)
USPC ......................... 430/285.1; 430/322; 430/330

(58) Field of Classification Search
CPC ....... B82Y 40/00; G03F 7/0002; G03F 7/004; G03F 7/11; H01L 51/0043
USPC ................................................ 430/322, 285.1
See application file for complete search history.

(56) References Cited

U.S. PATENT DOCUMENTS
2003/0166774 A1* 9/2003 Hoshi et al. ..................... 525/88
2006/0134556 A1* 6/2006 Nealey et al. ................. 430/311
(Continued)

FOREIGN PATENT DOCUMENTS
WO   2008/097736   8/2008
WO   2009/075720   6/2009
(Continued)

OTHER PUBLICATIONS
International Search Report mailed Sep. 21, 2012 in corresponding International Patent Application No. PCT/EP2012/060784.
(Continued)

*Primary Examiner* — Caleen Sullivan
(74) *Attorney, Agent, or Firm* — Pillsbury Winthrop Shaw Pittman LLP

(57) ABSTRACT

A block copolymer, adapted to self-assemble to form an ordered pattern on a substrate, has first and second blocks with a terminal moiety covalently bonded to the end of the first block. The molecular weight of the terminal moiety is 20% or less than that of the block copolymer and the terminal moiety has a low chemical affinity for the first block. The terminal moiety can assist the accurate positional placement of the domains of the ordered array and lead to improved critical dimension uniformity and/or reduced line edge roughness. The polymer may be useful in combination with a graphoepitaxy template, where the terminal moiety is chosen to associate with a sidewall of the template. This may reduce undesired aggregation of polymer domains at a sidewall and/or assist in domain placement accuracy.

16 Claims, 7 Drawing Sheets

(51) Int. Cl.
*G03F 7/00* (2006.01)
*C30B 19/00* (2006.01)

(56) References Cited

U.S. PATENT DOCUMENTS

| | | | |
|---|---|---|---|
| 2008/0193658 A1* | 8/2008 | Millward | 427/401 |
| 2009/0062470 A1* | 3/2009 | Millward et al. | 525/94 |
| 2009/0196488 A1 | 8/2009 | Nealey et al. | |
| 2010/0092873 A1* | 4/2010 | Sills et al. | 430/5 |

FOREIGN PATENT DOCUMENTS

| | | |
|---|---|---|
| WO | 2009/151834 | 12/2009 |
| WO | 2010/075116 | 7/2010 |
| WO | 2012/071330 | 5/2012 |
| WO | 2012/084558 | 6/2012 |

OTHER PUBLICATIONS

Karl O. Stuen et al., "Graphoepitaxial assembly of asymmetric ternary blends of block copolymers and homopolymers," Nanotechnology, vol. 21, pp. 1-7 (2010).

Miri Park et al., "Block Copolymer Lithography: Periodic Arrays of ~$10^{11}$ Holes in 1 Square Centimeter," Science, vol. 276, pp. 1401-1404 (May 30, 1997).

XiaoMin Yang et al., "Directed Block Copolymer Assembly versus Electron Beam Lithography for Bit-Patterned Media with Areal Density of 1 Terabit/$inch^2$ and Beyond," ACS Nano, vol. 3, No. 7, pp. 1844-1858 (2009).

Ankit Vora et al., "Blends of PS-PMMA Diblock Copolymers with a Directionally Hydrogen Bonding Polymer Additive," Macromolecules, vol. 43, No. 3, pp. 1199-1202 (2010).

* cited by examiner

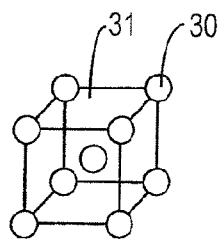
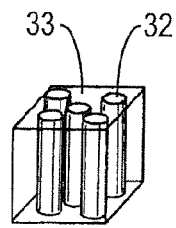
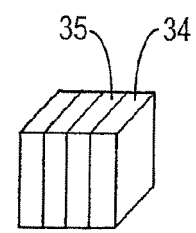
Fig. 3A  Fig. 3B  Fig. 3C
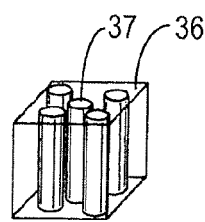
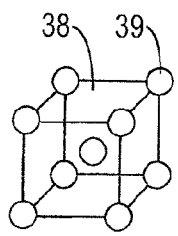
Fig. 3D  Fig. 3E
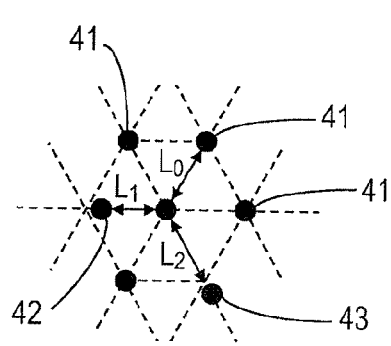
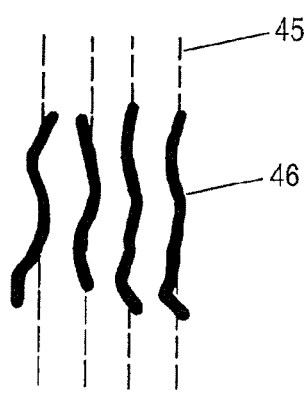
Fig. 4A  Fig. 4B

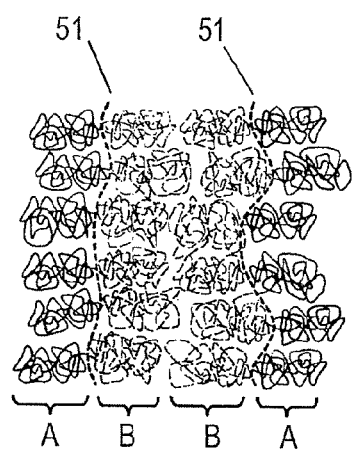
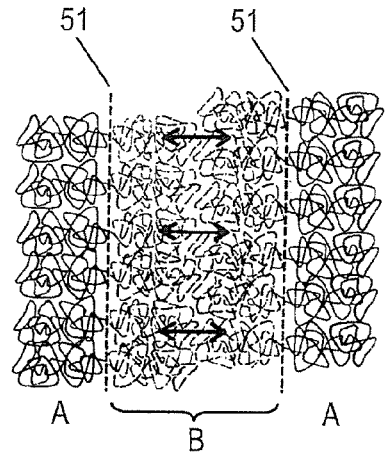
Fig. 5A  Fig. 5B
Fig. 6A
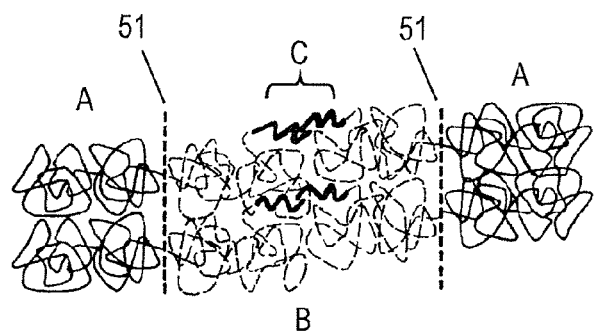
Fig. 6B

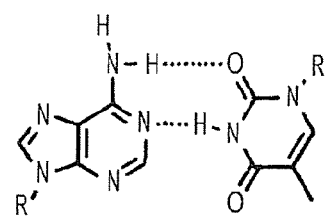 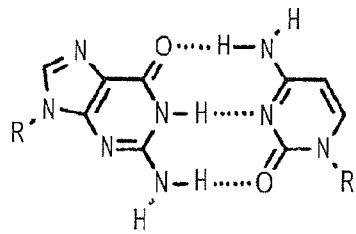
*Fig. 11A*  *Fig. 11B*
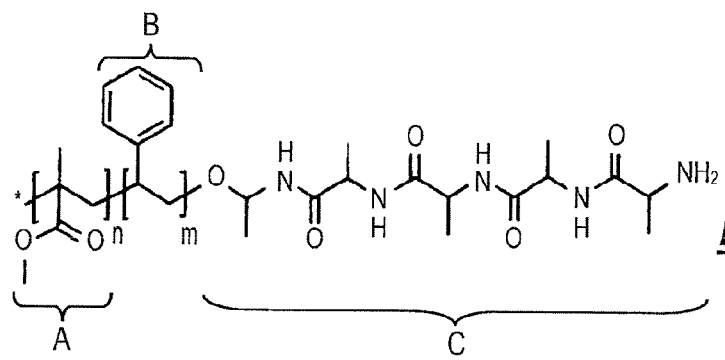
*Fig. 12*
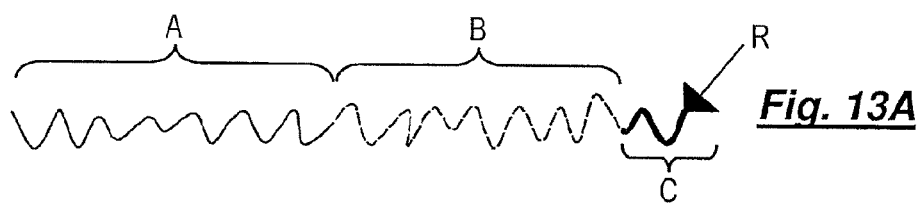
*Fig. 13A*
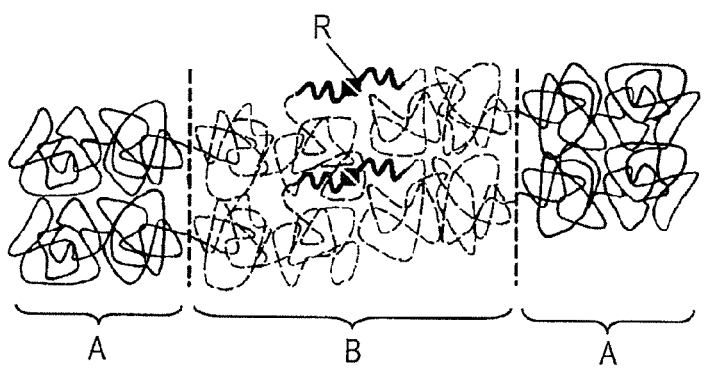
*Fig. 13B*

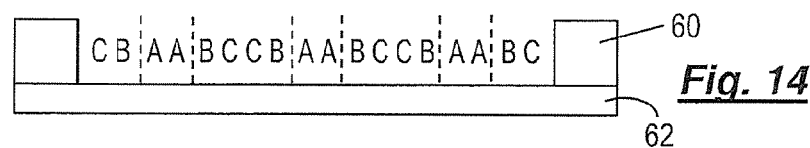
Fig. 14
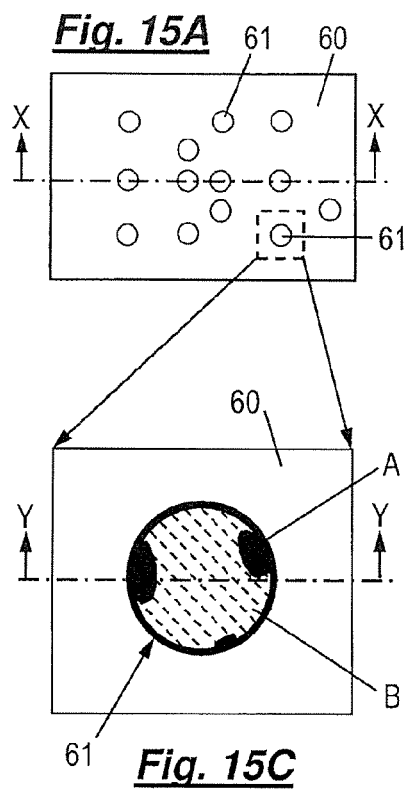
Fig. 15A
Fig. 15C
Fig. 15E
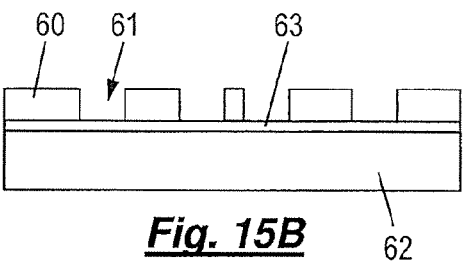
Fig. 15B
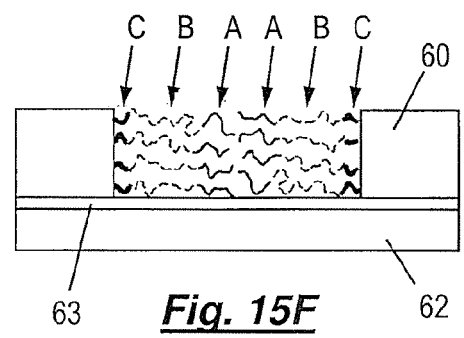
Fig. 15D
Fig. 15F

SELF-ASSEMBLABLE POLYMER AND METHODS FOR USE IN LITHOGRAPHY

CROSS REFERENCE TO RELATED APPLICATIONS

This application is the U.S. national phase entry of PCT patent application no. PCT/EP2012/060784, which was filed on Jun. 7, 2012, which claims the benefit of priority of U.S. provisional application No. 61/500,329, which was filed on Jun. 23, 2011 and U.S. provisional application No. 61/538,030, which was filed on Sep. 22, 2011 and U.S. provisional application No. 61/544,912, which was filed on Oct. 7, 2011, each of which are incorporated herein in its entirety by reference.

FIELD

The present invention relates to a self-assemblable polymer and a method for manufacture of a device by lithography.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, either of imprint templates or of other substrates and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer (A-B-C) may be useful, as may an alternating or periodic block copolymer (e.g. [-A-B-A-B-A-B-]$_n$ or [-A-B-C-A-B-C]$_m$ where n and m are integers). The blocks are connected to each other by covalent links in a linear or branched fashion (e.g. star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly (styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a polymer such as a block copolymer onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface is useful in chemical epitaxy and graphoepitaxy. It may be used on a surface between specific orientation regions of an epitaxy template. For instance in a chemical epitaxy template for aligning a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template for aligning such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few tens of ° C. above or below the order/disorder temperature $T_{OD}$ for the polymer, say up to about 50° C.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare. Other methods of transferring a pattern, known in the art, may be applicable to a pattern formed by self-assembly of a block copolymer.

Although the techniques set out above for applying a block copolymer self-assembled layer to a surface provide partial alignment of the block copolymer structure on a surface, the resulting self-assembled layer may exhibit a high level of incorrectly aligned polymer molecules, leading to one or more defects and/or poor uniformity in domain placement, which in turn may result in undesirable variation in critical dimension.

In a self-assembled structure, a defect is likely to be present, since in most cases, the thermodynamic driving force for self-assembly is provided by weak intermolecular interactions and is typically of the same order of magnitude as the entropy term. This characteristic is probably one of the main limitations in the exploitation of self-assembled features for lithography. A current state-of-the-art self-assembled layer may exhibit a defect rate of 1 in $10^3$ to 1 in $10^4$, expressed as the number of non-functional features of a multi-component device derived from the self-assembled layer (see for example Yang et. al, ACS Nano, 2009, 3, 1844-1858).

This is several orders of magnitude higher than the defect level that would be required for commercial effectiveness. These defects may appear as grain boundaries (discontinuities in the pattern) or as dislocations.

Self-assembly of a block copolymer is a process where the assembly of many small components (the block copolymer) results in the formation of a larger more complex structure (the nanometer sized features in the self-assembled pattern, referred to as domains in this specification) and the defects arise naturally from the physics controlling the self assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

If $T_{OD}$ is less than $T_g$ for the block copolymer, then a self-assembled layer will be unlikely to form or will be highly defected because of the inability of the molecules to align correctly when below $T_{OD}$ and below $T_g$. A desirable block copolymer for self assembly has $T_{OD}$ higher then $T_g$. However, once the molecules have assembled into a solid-like layer, even when annealed at a temperature above $T_g$ but below $T_{OD}$, the mobility of the polymer molecules may be insufficient to provide intermingling of coiled polymer chains to allow the molecules to relax into their states of lowest total free energy.

This may result in a domain placement error for the self-assembled polymer, where the phase separated domains of differing polymer blocks are not precisely located on the ideal theoretical lattice positions that they would occupy if the lowest total free energy state was reached.

For instance, adjacent polymer chains of similar blocks may coil up into entangled masses, with little intermingling of the chains. This failure of the identical blocks to intermingle can lead to local variation in domain sizes and pitch between spaced domains of the same type, leading to domain placement errors for 2-D arrays, such as cylindrical and lamellar phases, and/or to a high line edge roughness for a lamellar phase.

A further problem relates to the alignment of block copolymer in relation to a graphoepitaxy template, when such a template is used to direct and control the self-assembly process. There may be a tendency for one block type, with a high chemical affinity for a sidewall of a graphoepitaxy template, to aggregate disproportionately at the sidewall in order to minimize entropy loss. This undesirable effect may be particularly problematic when a cylindrical self-assembled phase is used in order to reduce the internal diameter of cylindrical apertures in a resist layer, for instance when such cylindrical apertures are intended for use in formation of contact dots on a substrate. The shorter blocks may tend to be driven towards the sidewall to minimize entropy loss, rather than forming an isolated central discontinuous domain in the cylindrical aperture, even when there is not a high chemical affinity between the shorter blocks and the sidewall.

Hence, it is desirable to provide a block copolymer and method which tackles one or more of these, or other, problems in the art regarding poor domain placement accuracy and poor line edge roughness for a self-assembled polymer layer. It is additionally or alternatively desirable to provide a block copolymer and method which tackles one or more of these, or other, problems in the art associated with ill-defined agglomeration of a polymer block at a sidewall of a graphoepitaxy template.

Accordingly, an embodiment of the invention relates to a self-assemblable block copolymer, for use in a resist layer, to improve domain placement accuracy and/or reduce line edge roughness in a self-assembled pattern formed from the block copolymer. An embodiment of the invention relates to the use of a block copolymer to improve alignment of a pattern where assembly has been directed by graphoepitaxy.

An aim, amongst others, is to provide a block copolymer and method useful for providing a self-assembled layer of block copolymer, e.g. suitable for use in device lithography, which provide a self-assembled pattern with good critical dimension uniformity, low line edge roughness and/or accurate domain placement. An aim is to provide a block copolymer and method which allows use of a graphoepitaxy template to provide good domain placement, e.g. for use of a suitable block copolymer in shrinking the internal width (e.g., diameter) of an aperture in a resist layer.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components.

Whenever appropriate, the use of the term "comprises" or "comprising" may also be taken to include the meaning "consists essentially of" or "consisting essentially of", or may include the meaning "consists of" or "consisting of".

Wherever mention is made of a "layer" in this specification, the layer referred to is to be taken to be layer of substantially uniform thickness, where present. By "substantially uniform thickness" is meant that the thickness does not vary by more than 10%, or by not more than 5%, of its average value across the layer.

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rates.

A first aspect of the invention provides a block copolymer comprising a first block of first monomer extending between first and second ends and a second block of second monomer covalently bonded to the second end of the first block, and adapted to undergo a transition from a disordered state to an ordered state at a temperature less than a temperature $T_{OD}$, the block copolymer further comprising:

a first terminal moiety covalently bonded to the first end of the first block, wherein the molecular weight of the first terminal moiety is 20% or less than that of the block copolymer, and wherein the first terminal moiety has a low chemical affinity for the first monomer.

This aspect is concerned with a self-assemblable block copolymer. This may be a block copolymer as set out hereinbefore comprising at least two different block types which are self-assemblable into an ordered polymer layer having the different block types associated into first and second domain types. The block copolymer may be a di-block, tri-block or multi-block copolymer. An alternating or periodic block copolymer may be used as the self-assemblable polymer. Although only two domain types may be mentioned in some of the following aspects and examples, an embodiment of the invention may be applicable to a self assemblable block copolymer with three or more different domain types.

The block copolymer comprises a first block of first monomer and a second block of second monomer. The block copolymer, as explained hereinbefore, is adapted to undergo a transition from a disordered state to an ordered state at a temperature less than $T_{OD}$. For the sake of clarity, the ordered state may also be achieved, for instance, by having the block copolymer in the presence of a solvent, with the ordering achieved by removal of the solvent, for instance by evaporation. For some block copolymers, the value of $T_{OD}$ may be greater than the decomposition temperature $T_{dec}$ for the polymer, and so ordering by loss of solvent may be desired. Similarly, annealing may be carried out in the presence of solvent, for instance added to the block copolymer using solvent vapor, in order to provide for increased mobility of the block copolymer to allow re-ordering without necessarily taking the block copolymer above $T_{OD}$.

In this specification, $T_{OD}$, $T_H$ and $T_g$ refer to the block copolymer as such. However, it will be understood that an embodiment of the invention may be put into effect with the block copolymer in the presence of a solvent which may affect the block copolymer chain mobility.

The first block of first monomer extends between first and second ends and the second block of second monomer is covalently bonded to the second end of the first block. Typically, the second block of second monomer will be directly covalently bonded to the second end of the first block, but in some suitable arrangements, a bridging moiety may be present between the blocks. This bridging moiety may comprise one or more further blocks of monomer.

The block copolymer further comprises a first terminal moiety covalently bonded to the first end of the first block.

The molecular weight of the first terminal moiety is 20% or less than the molecular weight of the block copolymer (i.e. the combined molecular weight of the first and second blocks and the first terminal moiety, and of any second terminal moiety, if present), for instance 10% or less. The first terminal moiety has a low chemical affinity for the first monomer. It is to be understood that the term "block copolymer" used herein includes the first and second blocks as well as any terminal moiety or any other parts of the molecule (for instance other blocks for a multi-block copolymer).

In other words, the first terminal moiety is not miscible with the domains formed by the first block and so will be driven to phase separate from them during self assembly. So, in other words, the block copolymer may be of the form A-B-C where B is the first block, A is the second block and C is the terminal moiety. For instance A may be a block of PS, B may be a block of PMMA and C may be a section of perfluorinated polymer such as perfluoroalkane.

The molecular weight of the first terminal moiety may be 5% or less than that of the block copolymer.

The first terminal moiety may suitably also have a low chemical affinity for the second monomers, so that it also immiscible with the domains formed by the second blocks in the self-assembled structure.

Alternatively, the first terminal moiety may have a chemical affinity for the second blocks. For instance with a polymer A-B-C, A may be a block of PMMA, B may be a block of PS and C a section of hydrophilic polymer such as PEO (polyethylene oxide).

The first terminal moiety may comprise or consist essentially of a block of second monomers, so that it is miscible with the domains formed by the second blocks in the self-assembled structure. So, in other words, the block copolymer may be of the form A-B-C where A is a block of PMMA, B is a block of PS and C is a further short section of PMMA. In this specification, PMMA is used to denote polymethylmethacrylate and PS is used to denote polystyrene.

Suitably, the first terminal moiety may comprise one or more functional groups adapted to provide bonding (i.e. chemical bonding) between adjacent first terminal moieties of adjacent first and second block copolymer molecules. The functional group may be adapted to provide hydrogen bonding between the adjacent terminal moieties.

For instance the first terminal moieties of first and second adjacent molecules of the block copolymer may be arranged to be mutually bondable by hydrogen bonding at a temperature at or below a transition temperature $T_H$, wherein $T_{OD}$ is greater than $T_H$ and wherein $T_H$ is greater than $T_g$. The first terminal moieties of first and second adjacent molecules of the block copolymer are suitably not mutually bondable by hydrogen bonding at temperatures in excess of $T_H$.

The hydrogen bonding may be between a first functional group of the first terminal moiety of the first adjacent molecule and a second functional group of the first terminal moiety of the second adjacent molecule and between a second functional group of the first terminal moiety of the first adjacent molecule and a first functional group of the first terminal moiety of the second adjacent molecule. In other words, each first terminal moiety may include two different, complementary functional groups so that adjacent terminal moieties include complementary functional groups capable of hydrogen bonding with each other.

This hydrogen bonding suitably may occur at a temperature in excess of a glass transition temperature $T_g$ for the self-assemblable block copolymer. No special meaning is assigned, in this specification, to the terms "first" and "second" block copolymer molecules: these are intended to describe adjacent identical molecules of the block copolymer.

In other words, the molecules may be arranged so that above some transition temperature $T_H$, the entropy contribution to the total free energy of the system arising from having the first terminal groups not mutually bonded will exceed the free energy contribution arising from having the hydrogen bonding in place, and so the bonds will be dissipated. This transition temperature $T_H$ may be measured by a suitable means such as DSC. In an arrangement, $T_H$ may be greater than $T_{OD}$ so that the formation of a hydrogen bond between the first terminal moieties may be used to pre-organize the block copolymer molecules by linking them together at the first terminal moieties, then initiating subsequent self-assembly below $T_{OD}$.

The transition temperature $T_H$ may be varied by variation of the chemical nature of the first terminal moiety and of the hydrogen bonding group contained therein. Suitably, the value of this transition temperature is less than the order disorder transition temperature for the block copolymer. This may ensure that the molecules of the block copolymer self-assemble in a manner primarily driven by the chemical incompatibility of the individual first and second blocks when the layer is cooled below the order-disorder transition temperature, rather than self-assembly being controlled by hydrogen bonding first terminal moieties, provided that the ordering takes place at a temperature above the transition temperature $T_H$ and below the disorder temperature $T_{OD}$.

A solvent present with the block copolymer may be used to vary the strength of hydrogen bonding. So, for instance, the block copolymer may be mixed with a solvent (such as an alcohol) which will compete with a functional group of the first terminal moieties with regard to hydrogen bonding. As the solvent is evaporated (for example to induce self-assembly) then hydrogen bonding between the first terminal moieties may increase.

The first terminal moieties may each comprise at least two mutually complementary functional groups positioned for hydrogen bonding between adjacent block copolymer molecules. For instance, the first terminal moiety may comprise at least one urea group, desirably at least 2 urea groups, with the urea group providing a first >NH (secondary amine) functional group and a second =O (carbonyl) functional group so that these groups, from adjacent first terminal moieties of adjacent block copolymer molecules, may form hydrogen bonds with each other.

A suitable first terminal moiety may comprise one or more amide groups, each with a first >NH (secondary amine) functional group and a second =O (carbonyl) functional group so that these groups, from adjacent first terminal moieties of adjacent block copolymer molecules, may form hydrogen bonds with each other.

A suitable first terminal moiety may comprise at least one 2-ureido[1H]-pyrimidin-4-one group, desirably at least two 2-ureido[1H]-pyrimidin-4-one groups.

A suitable first terminal moiety may comprise at least one peptide group. The hydrogen bonds may then be formed between a secondary amine and a carbonyl group. Suitably, the peptide group may comprise from 2 to 10 amino acids. A suitable peptide group is a polyalanine or oligoalanine.

A suitable first terminal moiety may comprise alcohol and pyridine groups arranged to interact to provide hydrogen bonding between adjacent terminal bridging moieties.

A suitable first terminal moiety may comprise complementary DNA bases as mutually hydrogen-bondable functional groups.

In an arrangement, the functional group of the first terminal moieties may be adapted to provide covalent bonding between adjacent first terminal moieties. For instance, the functional group may be an epoxy based group, which may be crosslinked when suitably excited by heat or actinic radiation (such as UV radiation), particularly in the presence of an acid generator.

A suitable functional group is an unsaturated group such as alkene or alkyne which may provide mutual covalent bonding between adjacent first terminal moieties.

A suitable functional group may be benzocyclobutene, which may be crosslinked to itself (for instance at a temperature of say from 150 to 200° C.).

Other suitable functional groups include an azide group (—$CH_2$—$N_3$) which may be mutually crosslinked using heat or actinic (e.g. UV) radiation, an acryoyl or glycidyl group (which may require the presence of a photo-acid generator for crosslinking), and/or a thiol group, which can reversibly form a disulfide bridge by oxidation.

The block copolymer may further comprise a second terminal moiety covalently bonded to the second block at an end of the second block not bonded to the first block. In other words, the second terminal moiety is at the opposite end of the molecule to the first terminal moiety and so is terminal to the second block.

Suitably, the molecular weight of the second terminal moiety is 20% or less, such as 10% or less, or 5% or less than the molecular weight of the block copolymer. The second terminal moiety suitably has a low chemical affinity for the second monomer.

The features as set out above for the terminal moiety may be applied mutatis mutandis to the second terminal moiety should such a second terminal moiety be present in the block copolymer.

The block copolymer of this aspect is useful when directed onto a surface of a substrate by means of graphoepitaxy or by chemical epitaxy as set out hereinbefore.

A second aspect of the invention provides a method of aligning a self-assembled block polymer according to the first aspect of the invention on a surface of a substrate, the method comprising:

providing, on the surface of the substrate, a graphoepitaxy template, the graphoepitaxy template comprising a sidewall having a high chemical affinity for the first terminal moiety, depositing a self-assemblable block polymer composition onto the graphoepitaxy template, and treating the self-assemblable polymer composition to provide self-assembly of the block copolymer directed by the graphoepitaxy template, wherein the self assemblable block copolymer and graphoepitaxy template are arranged to provide the self-assembled block copolymer aligned within the graphoepitaxy template with the first terminal moiety in direct contact with the sidewall.

This aspect provides a method of aligning a self-assembled block copolymer as described herein on a surface of a substrate. This aspect relates to the use of graphoepitaxial direction of assembly of the block copolymer. The method comprises providing, on the surface of the substrate, a graphoepitaxy template. This may be achieved, for instance, by depositing a resist layer on the surface of the substrate and subsequently patterning the resist layer using a conventional lithography technique, such as UV or extreme UV lithography, in order to provide a graphoepitaxy template formed by one or more apertures etched into the resist layer located between sidewalls formed by resist features on the surface of the substrate.

The graphoepitaxy template comprises one or more sidewalls having a high chemical affinity for the first terminal moiety. The self assemblable block copolymer and graphoepitaxy template are arranged to provide the self-assembled block copolymer aligned within the graphoepitaxy template with the first terminal moiety in direct contact with the sidewall.

The method further involves depositing a self-assemblable block polymer composition onto the graphoepitaxy template, and treating the self-assemblable polymer composition to provide self-assembly of the block copolymer directed by the graphoepitaxy template.

Typically, the layer of block copolymer may be provided on the substrate by a suitable deposition means such as spin-coating. The block copolymer may be held at a temperature above $T_{OD}$ or may be dissolved in a solvent to help ensure that it is in a disordered state prior to treatment to effect self-assembly (such as cooling or solvent evaporation).

This may result in the self-assemblable polymer aligning with the first terminal moieties of the block copolymer molecules in contact with the sidewall of the graphoepitaxy template.

The sidewall desirably has a higher chemical affinity for the first terminal moiety than for the first and second blocks (i.e., than for either the first or the second blocks).

The graphoepitaxy template may comprise an aperture therein, extending through the graphoepitaxy template from the surface and enclosed by a peripheral wall acting as a sidewall of the graphoepitaxy template. The aperture and block copolymer may be dimensioned to provide a self-assembled single central domain of second block in the aperture surrounded by a domain of first block with the first terminal moiety in contact with the peripheral wall.

A third aspect of the invention provides a method for forming a central hole within a cylindrical aperture in a resist layer on a surface of a substrate, the method comprising using the resist layer with cylindrical aperture as the graphoepitaxy template in the method of the second aspect of the invention to provide a self-assembled single central domain of second block in the aperture surrounded by an annular domain of first block with the terminal moiety in contact with the circumference wall, and etching out the central domain of second block to leave a hole surrounded by the annular domain of second block within the cylindrical aperture.

Hence, this aspect, based upon the embodiment above in respect of an aperture, provides a method for forming a central hole within a cylindrical aperture in a resist layer on a surface of a substrate, the method comprising using the resist layer with the cylindrical aperture as the above-described aperture of the graphoepitaxy template to provide a self-assembled single central domain of second block in the aperture surrounded by an annular domain of first block with the terminal moiety in contact with the peripheral wall. The method then involves etching out the central domain of second block to leave a hole surrounded by the annular domain of first block within the cylindrical aperture. The resulting hole, at the center of the original cylindrical aperture, is now of diminished diameter compared to the original diameter of the cylindrical aperture. This is because of the presence of the annular domain of first block remaining in place as a bush or sleeve inside the cylindrical aperture after the central domain of second block has been etched away. A difference in chemical nature of the first and second blocks may permit selective etching, as is known in this field. The first terminal moiety is desirably also left in place during removal of the central domain of second block. Hence, the etch resistance of the first terminal moiety is desirably similar to the etch resistance of the first block of first monomer, even though it also has a low chemical affinity for the first monomer.

A fourth aspect of the invention provides a lithography method for patterning a surface of a substrate by resist etching, wherein the method comprises providing a self-assembled block copolymer layer at the surface by a method described herein, wherein the self-assembled block copolymer layer is used as a resist layer.

This aspect provides a lithography method for patterning a surface of a substrate by resist etching, wherein the method comprises providing a self-assembled block copolymer layer at the surface by a method described herein, wherein the self-assembled block copolymer layer is used as a resist layer.

A fifth aspect of the invention provides a method for forming a device topography at a surface of a substrate, the method comprising using the self-assembled polymer layer formed by a method described herein as a resist layer and etching the substrate to provide the device topography.

This aspect provides a method for forming a device topography at a surface of a substrate, the method comprising using the self-assembled polymer layer formed by a method described herein as a resist layer and etching the substrate to provide the device topography. For instance, the different blocks of the ordered polymer may each exhibit different etch resistivity. Alternatively, one of the blocks may be selectively removed e.g. by photo-degradation and the remaining block may serve as an etch resist.

The following and foregoing features are applicable to all the various aspects of the invention where appropriate. When suitable, combinations of the features may be employed as part of the methods and compositions, for instance as set out in the claims. The methods and compositions are particularly suitable for use in device lithography. For instance the methods and compositions may be used for treatment or formation of a resist layer of self-assembled polymer for use in patterning a device substrate directly or for use in patterning an imprint template for use in imprint lithography.

BRIEF DESCRIPTION OF THE DRAWINGS

Specific embodiments of the invention will be described with reference to the accompanying Figures, in which:

FIGS. 3A to 3E schematically depict the different phases formed by poly(styrene-b-methylmethacrylate) polymers as the relative volume fractions of the polystyrene and PMMA blocks are varied relative to each other;

FIG. 4 schematically depicts a block copolymer self assembled into a cylindrical phase having 2-D hexagonal symmetry in FIG. 4A and into a lamellar phase in FIG. 4B, the depictions demonstrating domain placement errors and line edge roughness respectively;

FIGS. 5A and 5B schematically depict the molecular configurations of the first and second blocks of a di-block copolymer self-assembled into a lamellar phase showing how line edge roughness may originate;

FIG. 6A schematically depicts a block copolymer according to an embodiment of the invention.

FIG. 6B schematically depicts the block copolymer of FIG. 6A shown self assembled into a lamellar phase;

FIGS. 11A and 11B schematically depict complementary functional groups suitable for providing hydrogen bonding between first terminal moieties of a block copolymer according to an embodiment of the invention;

FIG. 12 schematically depicts, according to an embodiment of the invention, the molecular structure of a block copolymer and a first terminal moiety adapted to provide hydrogen bonding between adjacent first terminal moieties of adjacent block copolymer molecules, where the first terminal moiety is an oligoalanine;

FIG. 13A schematically depicts, according to an embodiment of the invention, a block copolymer having a terminal moiety comprising a functional group R adapted for covalent bonding;

FIG. 13B schematically depicts the block copolymer of FIG. 13A self assembled into a lamellar phase;

FIG. 14 schematically depicts, according to an embodiment of the invention, a cross-sectional side view through a substrate having a graphoepitaxy template thereon with a block copolymer self assembled between graphoepitaxy template sidewalls;

FIG. 15A schematically depicts a plan view of a resist layer on a substrate with cylindrical apertures;

FIG. 15B schematically depicts a cross sectional side view along the axis XX of FIG. 15A;

FIG. 15C schematically depicts an enlarged plan view of a cylindrical aperture and surrounding resist layer from FIG. 15A, with a self-assemblable AB block copolymer assembled in the cylindrical aperture;

FIG. 15D schematically depicts a cross sectional side view along the axis YY of FIG. 15C;

FIG. 15E schematically depicts an enlarged plan view of a cylindrical aperture and surrounding resist layer from FIG. 15A, with a self-assemblable block copolymer according to an embodiment of the invention assembled in the cylindrical aperture; and FIG. 15F schematically depicts a cross sectional side view along the axis YY of FIG. 15E.

DETAILED DESCRIPTION

Figure 1A:
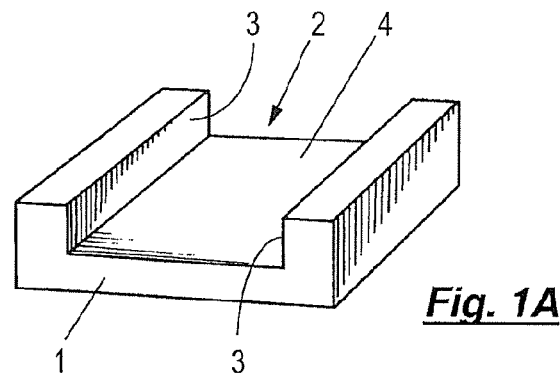
FIGS. 1A to 1C schematically depict directed self-assembly of A-B block copolymers onto a substrate by graphoepitaxy and formation of relief patterns by selective etching of one domain.
Figure 1B:
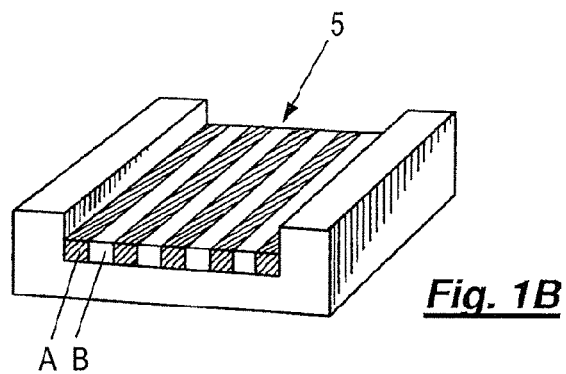
Figure 1C:
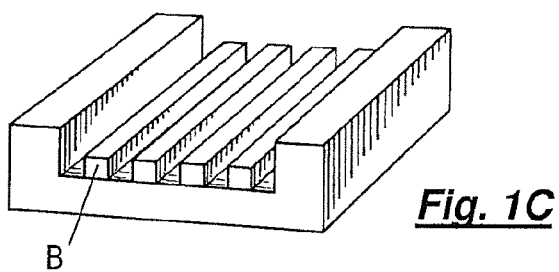

FIG. 1A shows a substrate 1 with a trench 2 formed therein bounded by side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete microseparated periodic domains during deposition of the block copolymer. This is referred to as graphoepitaxy. The type A domains have nucleated adjacent to the a side wall 3, which is also lyophilic (e.g., hydrophilic). In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
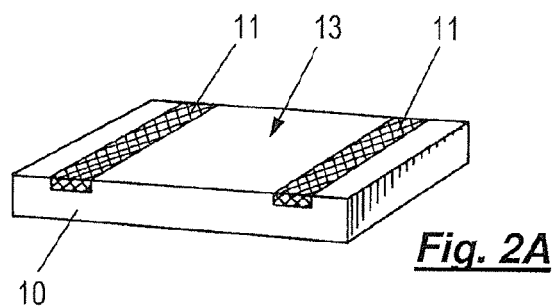
FIGS. 2A to 2C schematically depict directed self-assembly of A-B block copolymers onto a substrate by chemical pre-patterning and formation of relief patterns by selective etching of one domain.
Figure 2B:
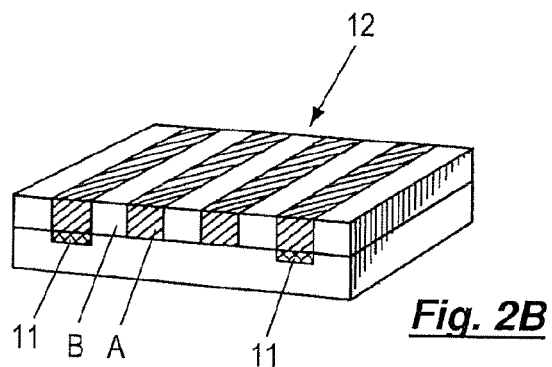
Figure 2C:
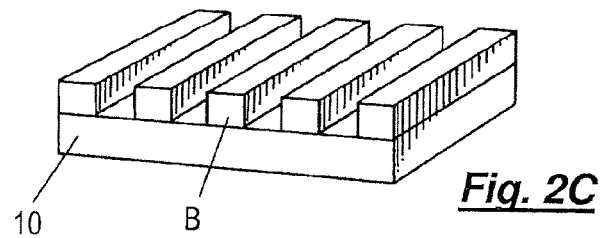

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In FIG. 3, FIGS. 3A to 3B show the progression of different phases formed by a self-assembled poly(styrene-b-methylmethacrylate) block copolymer in thin films on a surface. In FIG. 3A, a cubic phase is shown with the discontinuous domains being spheres 30 of PMMA within a continuous domain 31 of PS for a ratio PS:PMMA of 80:20.

As the ratio PS:PMMA reduces to 70:30, a cylindrical phase is formed with the discontinuous domains being cylinders 32 of PMMA and a continuous domain 31 of PS. At 50:50 ratio, a lamellar phase is formed as shown in FIG. 3C with one or more lamellae 34 of PMMA and one or more lamellae 35 of PS. With a ratio of 30:70 PS:PMMA, an inverted cylindrical phase is formed, shown in FIG. 3D, with the discontinuous domains being cylinders 37 of PS and a continuous domain 36 of PS. At a ratio of 20:80, shown in FIG. 3E, an inverted cubic phase is formed with discontinuous domains being spheres 39 of PS within a continuous domain 38 of PMMA.

FIG. 4A schematically depicts a block copolymer self-assembled into a cylindrical phase having 2-D hexagonal symmetry. Discontinuous domains of one block of the block copolymer should be uniformly spaced on an ideal hexagonal lattice, separated by a continuous domain of the other block of the block copolymer. The arrangement of broken lines shows the ideal theoretical hexagonal array onto which the block copolymer should self-assemble, with the domains 41 shown placed correctly on the ideal lattice. These ideally placed domains are mutually separated by a pitch $L_0$ measured between their centers. Domain 42 is shown misplaced from the ideal lattice so that it is a distance $L_1$ from the central domain with $L_1$ being less than $L_0$. Domain 43 is shown displaced from the lattice so it is a distance $L_2$ from the central domain, with $L_2$ being greater than $L_0$.

These placement errors are referred to herein as domain placement errors. There may also be differences in the sizes of the domains as well as in their accurate placement relative to the ideal lattice. This may lead to poor critical dimension uniformity (poor CDU) for the self-assembled polymer array.

In FIG. 4A, the broken lines 45 show the ideal placement positions for first domains 46 of first block of a block copolymer forming a lamellar phase, separated from each other by second domains of second block of the block copolymer. The deviation from ideal placement and hence from linearity of the first domains 46 is referred to herein as line edge roughness.

FIGS. 5A and 5B schematically depict the molecular configurations of the first and second blocks of a di-block copolymer self-assembled into a lamellar phase, such as shown in FIG. 4B, showing how line edge roughness (LER) may originate. In FIG. 5, the block B of adjacent block-copolymer molecules interact poorly and do not intermingle. FIG. 5 depicts how the flexible polymer chains are in a highly tangled or coiled configuration within the self assembled structure. Without wishing to be bound by theory, it is thought that the lack of intermingling between blocks on adjacent molecules may lead to poor compaction of the self assembled system into its optimum arrangement, leading to poor line edge roughness, shown by deviations from linearity for the domain boundaries 51.

In FIG. 5B, the adjacent blocks B of the adjacent molecules within the self-assembled structure are shown intermingling while still coiling together. This is thought to lead to a reduction in line edge roughness (LER) and more accurate placement of the domains on an ideal lamellar lattice, so that the domain boundaries 51 are straighter and more uniform.

FIG. 6A schematically depicts a block copolymer according to an embodiment of the invention. The block copolymer comprises a first block B of first monomer and covalently bonded to a second block A of second monomer at the second end of the first block and having a terminal moiety C bonded to the first end of block B. The first terminal moiety C is a short segment of polymer or oligomer chain which is immiscible with the block B. In this example, the terminal moiety C may have a molecular weight which is typically from 1 to 20% of the total block copolymer molecular weight.

In FIG. 6B, the block copolymer of FIG. 6A is shown self assembled into a lamellar phase. Without wishing to be bound by theory, it is thought that the additional interactions introduced by the presence of the first terminal moiety drives the first block, to which the first terminal moiety is bonded, to intermingle, particularly while the block copolymer is at a temperature that is in excess of $T_g$ but below $T_{OD}$. It is thought that the immiscibility of the short first terminal moiety with the first monomer of the first block, combined with its small size encourages the first terminal moieties to approach each other to lead to intermingling of the first block in the self-assembled array. The tendency of the terminal moieties to mutually aggregate (driven by desire to reduce free energy for the system) and to bond to each other may assist the accurate positional placement of the domains of the ordered self-assembled pattern and so may lead to improved critical dimension uniformity (and/or reduced line edge roughness for a lamellar pattern).

Figure 7:
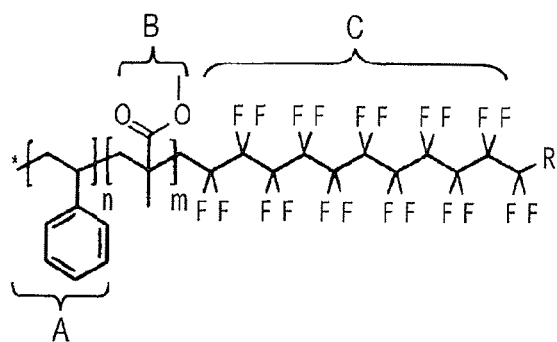
FIG. 7 schematically depicts the molecular structure of a block copolymer according to an embodiment of the invention.

FIG. 7 schematically depicts the molecular structure of a block copolymer according an embodiment of the invention. The first block B is of PMMA, covalently bonded to a second block A of PS at its second end, with a terminal moiety C bonded to the first end of block B. In this example, the block C is a perfluoroalkane (1 to 5% of the total polymer molecular weight). R represents continuation of the oligomeric first terminal moiety which will end at a suitable terminal group such as —$CF_3$.

Figure 8:
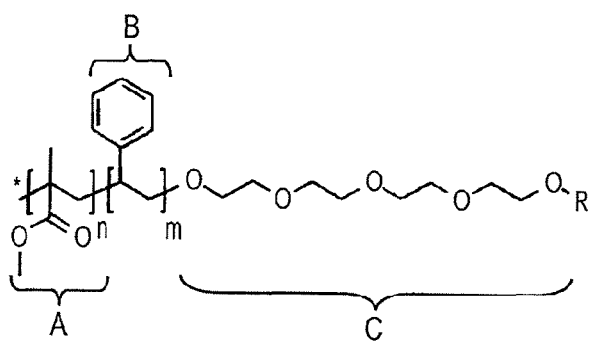
FIG. 8 schematically depicts the molecular structure of a block copolymer according to an embodiment of the invention.

FIG. 8 schematically depicts the molecular structure of a further block copolymer according an embodiment of the invention. The first block B is of PS, covalently bonded to a second block A of PMMA at its second end, with a terminal moiety C bonded to the first end of block B. In this example, the block C is a PEO segment (polyethylene oxide) at 1 to 5% of the total polymer molecular weight. R represents continuation of the oligomeric first terminal moiety which will end at a suitable terminal group such as —$CH_2OH$.

Figure 9A:
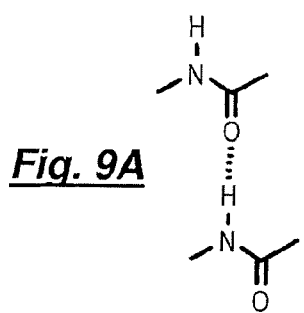
FIGS. 9A and 9B schematically depict functional groups suitable for providing hydrogen bonding between first terminal moieties of a block copolymer according to an embodiment of the invention.
Figure 9B:
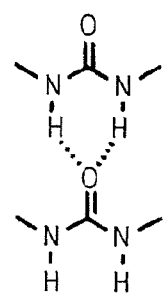

FIGS. 9A and 9B schematically depict functional groups suitable for providing hydrogen bonding between first terminal moieties of adjacent molecules of an embodiment of the block copolymer, shown to demonstrate how adjacent terminal moieties on different, adjacent molecules may be bonded by hydrogen bonding between identical functional groups. These functional groups may be included as part of the first terminal moiety or the functional groups may be polymerized together to form the first terminal moiety. FIG. 9A shows urea groups acting as both donor and acceptor for hydrogen bonding. FIG. 9B shows amide groups acting in a similar manner. The first terminal moiety may be oligomeric in nature, having from say 5 to 10 such groups forming it.

Figure 10:
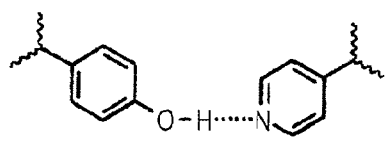
FIG. 10 schematically depicts a paired functional group suitable for providing hydrogen bonding between first terminal moieties of a block copolymer according to an embodiment of the invention.

FIG. 10 schematically depicts paired functional groups suitable for providing hydrogen bonding between first terminal moieties of adjacent molecules of an embodiment of a block copolymer of the first aspect of the invention. In this example, the functional group on one molecule is an alcohol, paired with a pyridine as functional group on the first terminal moiety of an adjacent molecule. The terminal moiety may be provided with a plurality of each type of functional group along its length positioned so that the groups of adjacent first terminal moieties may pair appropriately.

FIGS. 11A and 11B schematically depict paired functional groups which are complementary DNA bases suitable for providing hydrogen bonding between first terminal moieties of an embodiment of the block copolymer. The terminal moiety may be provided with a plurality of each type of DNA base along its length positioned so that the groups of adjacent first terminal moieties may pair appropriately.

FIG. 12 schematically depicts, according to an embodiment, the molecular structure of a block copolymer and a first terminal moiety adapted to provide hydrogen bonding between adjacent first terminal moieties of adjacent block copolymer molecules. The first block B is of PS, covalently bonded to a second block A of PMMA at its second end, with a terminal moiety C bonded to the first end of block B. In this example, the block C is an oligoalanine chain.

For hydrogen bonding between first terminal moieties, one or more functional groups providing hydrogen bonding may be selected, as explained hereinbefore, so that the bonding diminishes or disappears at higher temperatures, but is present at temperatures below $T_{OD}$ but above $T_g$ whereby the initial ordering of the self-assembled pattern may be driven by the first and second blocks, but first terminal groups may subsequently hydrogen-bond to each other to encourage intermingling of the polymer chains of first block to bring the system towards a lower free energy state with improved domain placement and/or reduced line edge roughness.

FIG. 13A schematically depicts a block copolymer according to an embodiment of the invention having a terminal moiety comprising a terminal functional group R adapted for covalent bonding. In FIG. 13B, the block copolymer of FIG. 13A is shown self assembled into a lamellar phase, with the functional group R covalently bonded together. A functional group suitable for providing covalent bonding has already been set out hereinbefore.

FIG. 14 schematically depicts a cross-sectional side view through a substrate 62 having a graphoepitaxy template 60 thereon with a block copolymer according to an embodiment of the invention self assembled between graphoepitaxy to template sidewalls. The block copolymer is denoted by the letters ABC, where B denotes the first block of first monomer, A denotes the second block of second monomer, and C denotes the first terminal moiety. The first terminal moiety has a higher chemical affinity for one or more sidewalls of the graphoepitaxy template 60 leading to the block copolymer self-assembling with the first terminal moiety C in contact with (i.e. wetting) the sidewall of the graphoepitaxy template. The dimensions of the trench formed between the sidewalls and the pitch of the lamellar array formed by the self-assembled polymer are selected so that the polymer may self-assemble as indicated with minimal strain. The natural pitch of the self-assembly may be measured, for instance by electron microscopy, from a self-assembled layer on a substrate free from a graphoepitaxy template. The terminal moiety, chosen to associate with the sidewall of the graphoepitaxy template, may thus reduce undesired aggregation of polymer domains at a sidewall and/or assist domain placement accuracy within the graphoepitaxy template.

This may be useful when the block copolymer is used to reduce the internal width (e.g., diameter) for contact holes in a resist layer, with the contact hole in the resist layer used as a graphoepitaxy template for depositing a single (e.g., cylindrical) domain.

FIG. 15A schematically depicts a plan view of a resist layer on a substrate with cylindrical apertures 61 in the resist layer 60 for use in contact formation.

FIG. 15B schematically depicts a cross sectional side view along the axis XX of FIG. 15A, demonstrating the cylindrical apertures 61 extending through the resist layer 60. The substrate 62 has a layer 63 thereon which provides neutral wetting towards the first and second domains of the block copolymer to be assembled into the cylindrical apertures 61 in order to form a central hole for contact formation.

FIG. 15C schematically depicts an enlarged plan view of a cylindrical aperture 61 and surrounding resist layer 60 from FIG. 15A, with a self-assemblable block copolymer assembled in the cylindrical aperture. FIG. 15D schematically depicts a cross sectional side view along the axis YY of FIG. 15C. The polymer is an AB copolymer dimensioned to self-assemble within the cylindrical aperture 61 to provide a circular central domain of A surrounded by an annular ring of B. This would have B:A=7:3 (phase volume ratio). Typically, A would be hydrophilic (e.g. PMMA) to wet the hydrophilic sidewall of resist layer 60. Most conventional high resolution lithography resist is hydrophilic after curing and so a hydrophilic block A such as PMMA will be suitable for aligning against the sidewall of the cylindrical aperture 61. In practice, entropy driven effects may lead to the short PMMA A block being driven to the sidewall rather than forming the desired central domain, giving an ill-defined and undesired ordering as shown in FIG. 15C.

FIG. 15E schematically depicts an enlarged plan view of a cylindrical aperture 61 and surrounding resist layer 60 from FIG. 15A, with a self-assemblable block copolymer according to an embodiment of the invention assembled in the cylindrical aperture. FIG. 15F schematically depicts a cross sectional side view along the axis YY of FIG. 15E. In this case, the blocks A and B are again dimensioned to provide a central domain of A with an annular disc of B surrounding it, and with the first terminal moiety C in contact with, and wetting, the sidewall of the cylindrical aperture 61. The phase volume ratio would be say C:B:A=1:7:3 (phase volumes). Without wishing to be bound by theory, it is believed that the short first terminal moiety C will have a tendency to order at the resist surface, at the sidewall of the cylindrical aperture 61, in order to reduce entropy loss. Furthermore, the chemical nature of the first terminal moiety C may be chosen to be hydrophilic in order to provide a high chemical affinity between the first terminal moiety and the sidewall.

The first terminal moiety C is different from both blocks A and B for the embodiment shown. However, in an embodiment, the terminal moiety C may be synthesized from the same monomer as that of block A.

Without wishing to be bound by theory, it is believed that the bonding between the first terminal moieties of adjacent block copolymer molecules may act to encourage intermingling of the coiled and entangled molecular chains of the first block during self assembly, and that this in turn may lead to improvement in line edge roughness (i.e. reduced line edge roughness) for a lamellar array and/or in critical dimension uniformity (i.e. more accurate domain placement and/or domain size) for a 2D pattern such as a cylindrical pattern.

The described and illustrated embodiments are to be considered as illustrative and not restrictive in character, it being understood that only preferred embodiments have been shown and/or described and that all changes and modifications that come within the scope of the inventions as defined in the claims are desired to be protected. For instance, rather than the first and second blocks being of polystyrene and polymethylmethacrylate, or vice versa, other mutually chemically immiscible blocks may be used in the self-assemblable block copolymer to drive the self-assembly process.

In an arrangement, it may be beneficial to use a mixture of the block copolymer of an embodiment of the invention with a conventional block copolymer in an optimal ratio so that a correct proportion of block copolymer of an embodiment of the invention is present in order to provide the block copolymer of an embodiment of the invention aligned with the first terminal moiety against the sidewall of a graphoepitaxy template acting as a key for the conventional block copolymer to self assemble within the template. In this case, the optimal ratio will depend upon the number of rows or lines (n) to be assembled within or between one or more sidewalls of a graphoepitaxy template.

It may be suitable to use a mixture of conventional block copolymers designated as an AB block copolymers, in combination with a CA or CB polymer, where is a terminal moiety as set out herein and A or B is a block of polymer as for the AB block copolymer. In such a mixture, the CA (or CB) block may assemble at the sidewall of the graphoepitaxy template (driven be entropic considerations) and act as a key or primer for assembly of the AB block copolymer in trenches formed between or within the one or more keyed/primed side walls of the graphoepitaxy template.

An embodiment of the present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate.

The invention claimed is:

1. A block copolymer comprising a first block of first monomer extending between first and second ends and a second block of second monomer covalently bonded to the second end of the first block, and adapted to undergo a transition from a disordered state to an ordered state at a temperature less than a temperature $T_{OD}$, the block copolymer further comprising:
a first terminal moiety covalently bonded to the first end of the first block, wherein the molecular weight of the first terminal moiety is 20% or less than the molecular weight of the block copolymer, and wherein the first terminal moiety has a low chemical affinity for the first monomer.

2. The block copolymer of claim 1, wherein the molecular weight of the first terminal moiety is 5% or less than the molecular weight of the block copolymer.

3. The block copolymer of claim 1, wherein the first terminal moiety has a low chemical affinity for the second monomer.

4. The block copolymer of claim 1, wherein the first terminal moiety comprises a functional group adapted to provide bonding between adjacent first terminal moieties of adjacent first and second block copolymer molecules.

5. The block copolymer of claim 4, wherein the functional group is adapted to provide hydrogen bonding between the adjacent terminal moieties.

6. The block copolymer of claim 5, wherein the first terminal moieties of first and second adjacent molecules of the block copolymer are arranged to be mutually bondable by hydrogen bonding at a temperature at or below a transition temperature $T_H$, wherein $T_{OD}$ is greater than $T_H$ and wherein $T_H$ is greater than the glass transition temperature $T_g$, and wherein the first terminal moieties of first and second adjacent molecules of the block copolymer are not mutually bondable by hydrogen bonding at a temperature in excess of $T_H$.

7. The block copolymer of claim 5, wherein the hydrogen bonding is between a first functional group of the first terminal moiety of the first adjacent molecule and a second functional group of the first terminal moiety of the second adjacent molecule and between a second functional group of the first terminal moiety of the first adjacent molecule and a first functional group of the first terminal moiety of the second adjacent molecule.

8. The block copolymer of claim 1, wherein the functional group is adapted to provide covalent bonding between the adjacent terminal moieties.

9. The block copolymer according to claim 1, wherein the first terminal moiety comprises or consists essentially of a block of second monomer.

10. The block copolymer according to claim 1, further comprising a second terminal moiety covalently bonded to the second block at an end of the second block not bonded to the first block, wherein the molecular weight of the second terminal moiety is 20% or less than the molecular weight of the block copolymer, and wherein the second terminal moiety has a low chemical affinity for the second monomer.

11. A method of aligning a self-assembled block polymer on a surface of a substrate, the block copolymer comprising a first block of first monomer extending between first and second ends and a second block of second monomer covalently bonded to the second end of the first block, and adapted to undergo a transition from a disordered state to an ordered state at a temperature less than a temperature $T_{OD}$, the block copolymer further comprising a first terminal moiety covalently bonded to the first end of the first block, wherein the molecular weight of the first terminal moiety is 20% or less than the molecular weight of the block copolymer, and wherein the first terminal moiety has a low chemical affinity for the first monomer, the method comprising:

providing, on the surface of the substrate, a graphoepitaxy template, the graphoepitaxy template comprising a sidewall having a high chemical affinity for the first terminal moiety;

depositing a self-assemblable block polymer composition onto the graphoepitaxy template; and treating the self-assemblable polymer composition to provide self-assembly of the block copolymer directed by the graphoepitaxy template, wherein the self assemblable block copolymer and graphoepitaxy template are arranged to provide the self-assembled block copolymer aligned within the graphoepitaxy template with the first terminal moiety in direct contact with the sidewall.

12. The method of claim 11, wherein the sidewall has a higher chemical affinity for the first terminal moiety than for the first and second blocks.

13. The method of claim 11, wherein the graphoepitaxy template comprises an aperture therein, extending through the graphoepitaxy template from the surface and enclosed by a peripheral wall acting as a sidewall of the graphoepitaxy template, and wherein the aperture and block copolymer are dimensioned to provide a self-assembled single central domain of second block in the aperture surrounded by a domain of first block with the terminal moiety in contact with the peripheral wall.

14. A method for forming a central hole within a cylindrical aperture in a resist layer on a surface of a substrate, the method comprising:

using the resist layer with the cylindrical aperture as the aperture of the graphoepitaxy template in the method of claim 13 to provide a self-assembled single central domain of second block in the aperture surrounded by an annular domain of first block with the first terminal moiety in contact with the peripheral wall, and etching out the central domain of second block to leave a hole surrounded by the annular domain of first block within the cylindrical aperture.

15. A lithography method for patterning a surface of a substrate by resist etching, wherein the method comprises providing a self-assembled block copolymer layer at the surface by the method of claim 11, wherein the self-assembled block copolymer layer is used as a resist layer.

16. A method for forming a device topography at a surface of a substrate, the method comprising using the self-assembled polymer layer formed by the method of claim 11 as a resist layer and etching the substrate to provide the device topography.

\* \* \* \* \*